United States Patent [19]

Bush et al.

[11] 4,379,186

[45] Apr. 5, 1983

[54] FLUIDIZING FINE POWDER

[75] Inventors: Eric L. Bush, Matching Green, Near Harlow; Ernest J. Workman, Bishop's Stortford, both of England

[73] Assignee: ITT Industries, Inc., New York, N.Y.

[21] Appl. No.: 242,201

[22] Filed: Mar. 10, 1981

[30] Foreign Application Priority Data

Mar. 20, 1980 [GB] United Kingdom ............... 8009410

[51] Int. Cl.$^3$ ..................... B01J 8/32; C23C 11/02
[52] U.S. Cl. ..................................... 427/213; 134/10
[58] Field of Search ................. 118/DIG. 5; 427/213; 134/10

[56] References Cited

U.S. PATENT DOCUMENTS 3,251,337  5/1966  Latta ................................... 427/213
3,382,093  5/1968  Nack .................................. 427/213
4,016,304  4/1977  Beatty ................................. 427/213

FOREIGN PATENT DOCUMENTS 1511742  5/1978  United Kingdom .
1484208  9/1978  United Kingdom .

OTHER PUBLICATIONS

Cline, Vapor Deposition of Metals on Ceramic Particles, pp. 385–387.

Primary Examiner—Sam Silverberg
Attorney, Agent, or Firm—T. E. Kristofferson; T. L. Peterson

[57] ABSTRACT

Powder which is too fine to be fluidized on its own is fluidized admixed with a sufficient quantity of coarser powder of a particle size that can be fluidized on its own. The process may be used for coating fine powders with valve-metal for the manufacture of capacitor electrodes.

7 Claims, No Drawings

FLUIDIZING FINE POWDER

BACKGROUND OF THE INVENTION

This invention relates to the fluidization of fine powders.

One particular example of a manufacturing process that may involve fluidization of fine powders is the provision of valve-metal coated powder for compaction to form capacitor anodes of electrolytic capacitors.

Thus for instance particles of an inert material such as alumina may be coated with a layer of tantalum to provide a coated powder which can be compacted to form an anode having similar electrical properties to that of an anode made of particles of comparable size made entirely of tantalum. One advantage of using the coated power is in this instance the cost saving resulting from the use of less tantalum. In the case of coating the particles with aluminum an advantage of using aluminum coated powder over particles composed entirely of aluminum is that the coated powder is easier to compact into a form suitable for a capacitor anode because the hard cores of the particles are useful in transmitting the compaction forces through the body of material being compacted and are also useful in limiting the extent of the compaction so that body is still porous after compaction. A convenient way of coating the particles is by a chemical vapor reaction process performed in a fluidized powder bed.

In order to make a coated powder compacted anode that is superior or at least competitive with anodes made of powder that is made exclusively of valve-metal it is generally desirable to use coated powder that has a particular size that is comparable with that of the valve-metal powder. In recent years there has been a move towards using finer powders so that now powders with a particle size in the range 1 to 5 microns are used. Whereas it has been found in a series of tests relatively easy to fluidize alumina powders down to a particle size of about 13 microns, the fluidization of 9 micron powder could not be reliably achieved in a conventional spouted bed fluidization chamber, and fluidization of 3 micron powder was not achieved at all.

SUMMARY OF THE INVENTION

We have found that this problem can be overcome by adding, to the fine powder that is too fine readily to be fluidized, a quantity of a coarser powder that can readily be fluidized. Preferably this coarser powder is sufficiently coarser than the fine powder to be readily separable from the fine powder by a single simple sieving operation.

As will be readily understood the minimum proportion of the coarser powder that needs to be added to the fine powder will depend very much upon the design of the bed in which the powder is to be fluidized.

DETAILED DESCRIPTION OF THE INVENTION

In a particular investigation using the fluidized bed having a diameter of about 8 cm and between ten and twenty 0.5 to 1.0 mm diameter apertures in its base it was found by visual inspection that 13 micron alumina (sapphire) could be properly fluidized, whereas with 9 micron powder proper fluidization could only occasionally be obtained while at other times channelling of the powder occurred. With 3 micron powder this channelling was more pronounced and proper fluidization was never obtained. However, by adding a quantity of one part by weight of 120 micron alumina to a charge of between two and three parts of 3 micron alumina lying in the fluidized bed it was found that proper fluidization became established and the two powders become intimately mixed.

Further investigations were made using spouted beds of a construction suitable for coating the fluidized powder with tantalum by the heterogeneous phase reaction promoted at high temperature between tantalum pentachloride vapor and hydrogen. In these spouted beds it was not found convenient to provide any form of window for visual observation of the fluidization, but, with experience, proper fluidization could be inferred from an observation of the changes in temperature occurring at different parts of the bed. Later this could be verified by inspection of the coated powder produced by the process.

In the case of a 5 cm diameter spouted bed reactor a charge of 250 grams of 3 micron alumina was placed in the reactor and an attempt made to fluidize it with a flow of 8 liters per minute of hydrogen. The upper end of the reactor penetrated into a furnace maintained at a temperature of about 1000° C. so that if the flow of hydrogen were augmented with a flow of tantalum pentachloride vapor this vapor should be reduced to tantalum on any alumina particles present in the upper reaches of the reactor. A thermocouple measured the wall temperature of the reactor in the conical region immediately above the reactor jet. It was found that this arrangement produced a cone temperature lying in the range 300° to 350° C. which did not vary significantly with time.

There was channelling of the charge of alumina powder and an increase in the hydrogen flow rate merely served to increase this channelling rather than promote proper fluidization of the charge. When, however, the charge of 3 micron alumina was replaced with the same weight of 13 micron alumina the hydrogen flow rate of 8 liters per minute was found to produce satisfactory fluidization. The cone temperature was in the region of 550° C. and fluctuated by several tens of degrees over a period of several minutes. This behavior was found to be indicative of good fluidization.

In order to promote proper fluidization of the 3 micron powder a quantity of coarser powder, also of alumina, was added to the fine powder. The fluidization was in this instance required in order to be able to coat the individual fine particles with tantalum in order to make a capacitor using less tantalum than would be required in an equivalent capacitor whose anode was made of solid tantalum particles. The coating process will coat the coarse particles along with fine particles. It is therefore desirable to minimize the wastage incurred by coating the coarse particles notwithstanding the fact that most if not all of the tantalum coating on the coarse particles can be recovered by further processing. For this reason a convenient particle size for the coarse powder is 120 microns. This is readily separable from the 3 micron powder by sieving, and has the further advantage of having a smaller specific surface than that possessed by smaller particle sizes, and yet is not too large to be readily fluidizable on its own in the reactor.

The ratio by weight of fine powder to coarse powder that could be properly fluidized in this reactor was found to be as large as 10 to 1. However it was found preferable for reliability and quality of yield to work with a smaller ratio in the region of 3 to 1. Under the previously quoted condition of charge mass and flow rate it was found that good fluidization was produced and resulted in a measured cone temperature fluctuating around the range from 450° to 500° C.

The tantalum pentachloride vapor was added to the hydrogen flow by passing hydrogen chloride at a rate of 0.4 liters per minute over tantalum metal maintained at a temperature of about 500° C. When the coating process was applied to the 3 micron powder alone the resulting product consisted of a solid honeycomb structure mass, together with a small quantity of partly coated powder particles and a small quantity of those that were uncoated. The process was also found liable to produce hard and soft scale, and a cake of agglomerated particles which it is presumed had been lifted as agglomerates, rather than as fully separated particles, into the tantalum deposition zone. The metal coating thus covers only the outer surface of the agglomerate, which is liable to break up when the coated powder is later compacted to form a capacitor anode. This sort of breaking up of agglomerates is undesirable because it produces an inferior metal bonded structure having a greater variability of metal thickness. Both these features detract from capacitor performance.

The addition in adequate quantities of the coarse powder to the fine 3 micron powder produces a product which consists predominately of individually coated particles. With 3 micron powder and coating thicknesses of less than 0.5 micron there is liable to be incomplete coverage of the entire surface of each particle due to the phenomenon of island growth. The solution of this problem by the use of a suitable nucleating agent is described and claimed in our co-pending U.S. patent application Ser. No. 143,975 filed Apr. 28, 1980. The teachings contained therein may with advantage also be applied to coating of powders of mixed particle sizes.

Repeating the experiments on powder ratios with the same powder particle size, using a 10 cm diameter reactor, it was found that good fluidization was obtained with a fine to coarse powder ratio of 3 to 1 by weight. At a ratio of 5 to 1 the bed function appeared reasonable. The measured cone temperature fluctuated, but its mean was lower than before, and capacitors made from the resulting 3 micron coated powder, after removal of the 120 micron powder by sieving, showed poorer electrical characteristics. At a powder ratio of 6 to 1 the bed function was poor (as revealed by temperature fluctuation) and the resulting 3 micron coated powder made poor quality capacitors.

In the foregoing, where mention has been made of specific values of particle size, these have been the values normally quoted for specific mesh sizes, and therefore refer to a mean value of substantially that size. Thus the 3 micron powder used was 1,200 mesh powder, for which the mean particle size is substantially 3 microns.

It should be understood that the invention is applicable to the manufacture of valve metal coated powders employing valve metals other than tantalum. These include niobium and aluminum and also certain alloys.

It will further be appreciated that the invention is not applicable solely to capacitor manufacture but is applicable to other processes such as for instance the provision of catalysts with a high specific surface.

Although in the foregoing examples the fine and the coarse powders were made of the same material that is not an essential requirement for the performance of the invention, though in most instances it will generally be preferred to use materials whose densities are not too disparate.

The foregoing describes the invention by referring to specific embodiments. Those skilled in the art will perceive modifications within the spirit of the present invention, the scope of which is limited solely by the appended claims.

What is claimed is:

1. A process of coating inert powder that is too fine to be readily fluidized on its own comprising the step of:
   placing the powder in a fluidization chamber admixed with a sufficient quantity of additional coarse powder of a substantially large particle size, large enough to be capable of being fluidized on its own in said fluidization chamber, the quantity by weight of said fine powder significantly exceeding the quantity by weight of said coarse powder but the ratio by weight of said fine powder to said coarse powder being not more than about 10;
   fluidizing the fine powder with the coarse powder in the chamber with a gas and/or vapor phase fluid; and
   coating the fine powder with a valve metal.

2. A process as set forth in claim 1 wherein:
   said valve metal is selected from the group consisting of tantalum, niobium, aluminum, and an alloy of one of said metals.

3. A process as set forth in claim 2 wherein: said inert powder is alumina.

4. A process as set forth in claim 3 wherein:
   the ratio by weight of said fine powder to said coarse powder is about 3.

5. A process as set forth in claim 1 wherein:
   said ratio by weight of said fine powder to said coarse powder is within the range of 2:1 and 5:1.

6. A process as set forth in claim 1 wherein:
   said fine powder has a particle size of less than 10 microns.

7. A process as set forth in claim 1 wherein:
   said powders are alumina;
   said valve metal is selected from the group consisting of tantalum, niobium, aluminum and an alloy of one of said metals;
   said ratio by weight of said fine powder to said coarse powder is within the range of 2:1 and 5:1; and
   said fine powder has a particle size of less than 10 microns.

* * * * *